US006309952B1

(12) United States Patent
Ridley et al.

(10) Patent No.: US 6,309,952 B1
(45) Date of Patent: *Oct. 30, 2001

(54) PROCESS FOR FORMING HIGH VOLTAGE JUNCTION TERMINATION EXTENSION OXIDE

(75) Inventors: Rodney S. Ridley, Mountaintop; Jason R. Trost, Drums; Raymond J. Webb, Mountaintop, all of PA (US)

(73) Assignee: Fairchild Semiconductor Corporation, South Portland, ME (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/167,177

(22) Filed: Oct. 6, 1998

(51) Int. Cl.[7] ................................................ H01L 21/425
(52) U.S. Cl. .................. 438/530; 438/787; 438/799; 438/141
(58) Field of Search .................... 438/308, 141, 438/522, 418, 787, 799

(56) References Cited

U.S. PATENT DOCUMENTS

| 4,187,125 | * | 2/1980 | Feist ........................ 148/1.5 |
| 4,676,869 | * | 6/1987 | Lee et al. ..................... 156/643 |
| 4,677,740 | * | 7/1987 | Shifrin et al. ................. 29/576 |
| 4,743,569 | * | 5/1988 | Plumton ...................... 438/522 |
| 5,141,881 | * | 8/1992 | Takeda et al. ................. 437/31 |
| 5,192,712 | * | 3/1993 | Aronowitz et al. ............. 438/418 |
| 5,462,898 | * | 10/1995 | Chen et al. .................. 437/235 |
| 5,485,027 | * | 1/1996 | Williams et al. .............. 257/343 |
| 5,538,923 | * | 7/1996 | Gardner et al. ............... 438/264 |
| 5,605,852 | | 2/1997 | Bencuya ..................... 437/40 |
| 5,614,421 | | 3/1997 | Yang ........................ 437/24 |
| 5,639,676 | | 6/1997 | Hshieh et al. ................ 437/40 |
| 6,034,396 | * | 3/2000 | Wu .......................... 257/332 |

FOREIGN PATENT DOCUMENTS

| 538807-A1 | * | 4/1993 | (EP) | ............... H01L/27/06 |
| 2620271-A | * | 3/1989 | (FR) | ............... H01L/27/06 |
| 409213895-A | * | 8/1997 | (JP) | ............... H01L/27/08 |
| 410107143-A | * | 4/1998 | (JP) | ............... H01L/21/768 |

OTHER PUBLICATIONS

East Abstract of Japanese Document 60–244,043, Published Dec. 3, 1985, Nagakubo, Y.*
Wolf, S. and Tauber, R. "Silicon Processing for the VLSI Era: Process Technology". vol. 1, pp. 200–201, 219–223, 1986.*

* cited by examiner

Primary Examiner—Matthew Smith
Assistant Examiner—Renzo N. Rocchegiani
(74) Attorney, Agent, or Firm—Allen, Dyer, Doppelt, Milbrath & Gilchrist, P.A.

(57) ABSTRACT

A process for forming a junction termination extension (JTE) oxide having reduced total oxide charge and $SiO_2$—Si interface trap density parameters uses precursor densified thin oxide layers to improve the quality of subsequently formed thicker oxide layers, and multiple anneals to remove implant damage and set geometry parameters. After formation of a first dual oxide layer, and a post-oxidation anneal, the oxide is patterned and JTE regions are implanted. Implant-based near surface crystalline damage is annealed out in a non-oxidizing ambient, and JTE dopants are partially driven into adjoining material of the substrate. A thin dense bulk precursor oxide layer is grown on the exposed JTE dopant-implanted surface portions of the substrate, followed by forming the bulk of the JTE oxide in a steam or wet oxygen atmosphere. The substrate is then annealed in a non-oxidizing ambient, to cause a further drive-in of the JTE dopants. The associated reduction in $Q_{ox}$ and $D_{it}$ improves high voltage edge stability.

8 Claims, 5 Drawing Sheets

PROCESS FOR FORMING HIGH VOLTAGE JUNCTION TERMINATION EXTENSION OXIDE

FIELD OF THE INVENTION

The present invention relates in general to the manufacture of high-voltage semiconductor integrated circuits, and is particularly directed to a new and improved process for forming a junction termination extension (JTE) oxide that enjoys reduced total oxide charge (Qox) and $SiO_2$—Si interface trap density (Dit) parameters, thereby offering improved high voltage edge stability.

BACKGROUND OF THE INVENTION

High-voltage discrete and integrated circuit devices, which are currently employed in a wide variety of electrical and electronic circuit architectures, are subject to excessive electric field intensity created in the vicinity of a reverse-biased PN junction. One particularly effective mechanism to deal with this problem has been to use a junction termination extension (JTE), as a barrier against the effects of the electric field. In a typical architecture, the JTE device is passivated by a relatively thick bulk oxide layer that is formed by the process sequence shown in FIG. 1, respective steps of which yield a device structure shown in the associated cross-sectional diagrams of FIGS. 2A–2F.

More particularly, as shown at step 101, the conventional process begins by exposing the top surface of a semiconductor (silicon) substrate 1, shown in FIG. 2A, to a 'wet' or steam ambient, so as to rapidly grow a relatively thick ubiquitous oxide layer 2, that is to serve as part of the bulk JTE oxide. As shown at step 103 and FIG. 2B, the oxide layer 2 is then patterned, etched and cleaned/rinsed to open a plurality of implant apertures 3, which expose corresponding (JTE dopant-implant) surface portions 4 in the top surface of substrate 1.

In step 105, conductivity type determining impurities 5 are implanted through the implant apertures 3 of the oxide layer 2, forming a plurality of JTE surface regions shown at 6 in FIG. 2C. This implant step introduces unwanted near-surface pockets of crystalline damage 7 in the vicinity of the top surface of the silicon substrate. In order to remove this crystalline damage and prevent stacking fault formation, at step 107, a wet or stream screen oxide layer 8 is rapidly grown directly on the JTE surface regions 6, as shown in FIG. 2D. Unfortunately, because the oxide layer 8 is grown rapidly and directly upon the implanted surface of the silicon, it is of relatively poor quality, and can be expected to negatively impact the quality of any subsequently formed oxide.

Following formation of the screen oxide layer 8, the device is subjected to a dopant drive-in step 109, which causes the dopant of the implanted regions 6 to diffuse into the surrounding substrate, and essentially define the JTE structure, as shown at 6' in FIG. 2E. Although some additional dopant diffusion will occur during subsequent oxidation,.the bulk of the dopant drive-in is completed in this step. The JTE oxide process is completed by performing a further rapid steam or wet oxidation step 111, which fills in the implant apertures 3 with oxide 9 and results in the JTE structure shown in FIG. 2F.

Because each of the oxide layers formed in the process of FIGS. 1 and 2, particularly those overlying the implanted regions, are grown rapidly in a wet or stream atmosphere, they are of relatively low density. As a result they facilitate segregation or out-diffusion of dopants into the oxide, and reduce the quality of any oxide grown thereon. This has the unwanted effect of allowing the total oxide charge (Qox) and $Sio_2$—Si interface trap density (Dit) to increase, which degrades high voltage stability.

SUMMARY OF THE INVENTION

In accordance with the present invention, the above-referenced shortcomings of conventional JTE oxide formation are effectively obviated by employing precursor densified thin oxide layers to improve the quality of subsequently formed thicker oxide layers, and performing multiple anneals in a dry or non-oxidizing atmosphere to remove implant damage and to set finalized geometry parameters. The use of such an atmosphere for post JTE oxidation annealing substantially lowers Qox and Dit.

In order to ensure precise control of subsequent oxide formation, a relatively thin and dense precursor oxide layer is ubiquitously grown on the surface of a silicon substrate in a dry oxygen ambient. The thickness of the oxide layer is increased in a steam or wet oxygen atmosphere, causing the growth of a relatively thick silicon dioxide layer. Because the thin precursor oxide layer is highly densified, it increases the density and quality of the thick oxide layer.

A post-oxidation anneal is then performed in a dry ambient or non-oxidizing atmosphere, which substantially reduces Qox and Dit. The oxide then masked and etched to form a plurality of dopant implant apertures in the oxide layer. JTE dopants are then implanted through the implant apertures of the oxide layer, forming a plurality of conductivity-modifying semiconductor JTE regions that extend to a prescribed implant depth from the top surface of the silicon substrate.

In order to remove near surface crystalline damage caused by the implant, the substrate is annealed in a non-oxidizing or inert gas ambient. The non-oxidizing atmosphere of the annealing step prevents oxidation of the top surface of the substrate from which the JTE regions extend, and thereby avoids negatively impacting subsequent oxide formation. A dry oxide ambient cannot be used to anneal out the crystalline damage during this step, since formation of a highly dense oxide layer may cause the formation of oxidation-induced stacking faults. The JTE dopants are then partially driven away from the near-surface portions into adjoining material of the substrate, to prevent segregation of the dopant into the oxide that will be subsequently grown.

A relatively thin and highly densified bulk oxide precursor layer is then grown on the exposed JTE dopant-implanted surface portions of the substrate to ensure precise control of subsequent oxide formation. The bulk of the JTE oxide is then formed in a steam or wet oxygen atmosphere.

After the bulk oxide has been grown to its desired thickness, the substrate is annealed in a non-oxidizing or inert gas ambient, to cause a further drive-in of the JTE dopants. The dry or non-oxidizing atmosphere of the post JTE oxidation annealing step substantially lowers Qox and Dit. The reduction in Qox and Dit (and thereby the extent to which high voltage edge stability is improved) may be determined by carrying out conventional capacitance-voltage and associated electrical parameter measurements, such as those commonly employed for MOS capacitor structures.

DETAILED DESCRIPTION

The process through which a high voltage junction termination extension oxide is formed on a semiconductor substrate/wafer in accordance with a preferred embodiment of the present invention will now be described with reference to the cross-sectional diagrams of FIGS. 3A–3I, that show the state of the device at respective steps of the processing flow sequence of FIG. 4.

Figure 1:
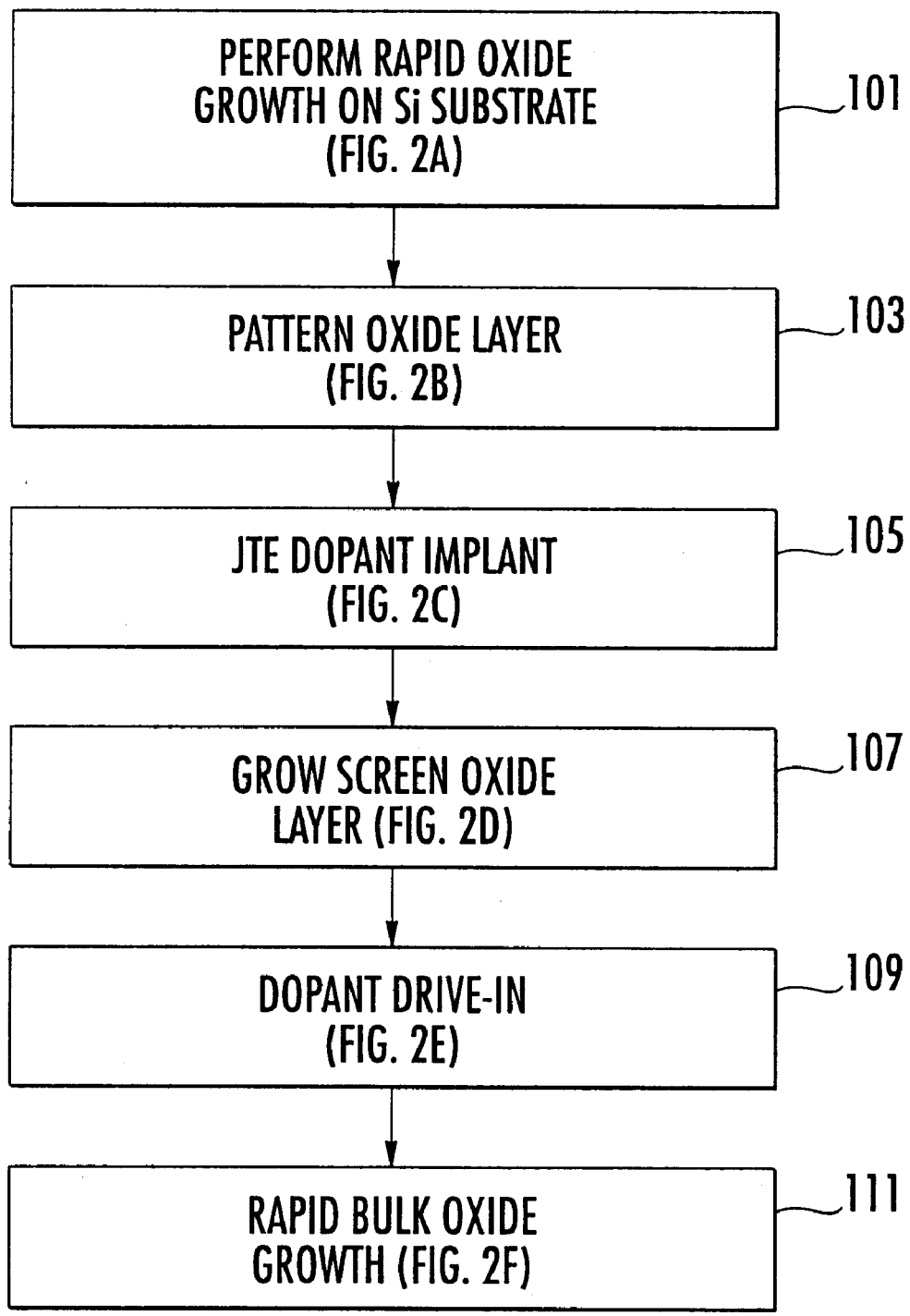
FIG. 1 shows the process steps of a conventional JTE oxide process.
Figure 2A:
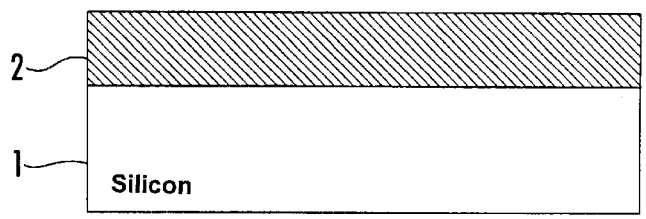
FIGS. 2A–2F are diagrammatic sectional views of a JTE semiconductor structure at respective steps of the process of FIG. 1.
Figure 2B:
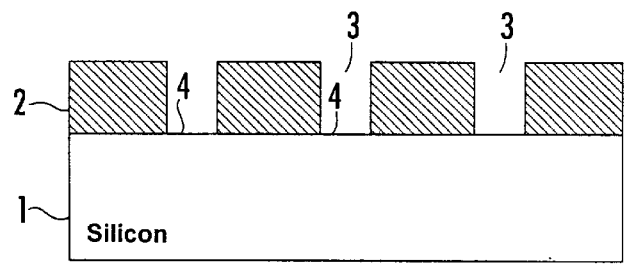
Figure 2C:
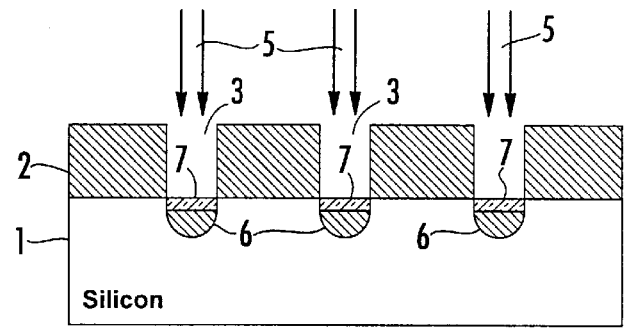
Figure 2D:
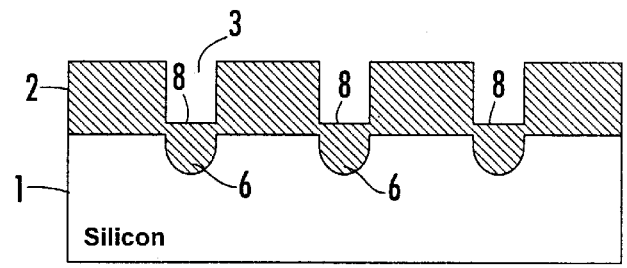
Figure 2E:
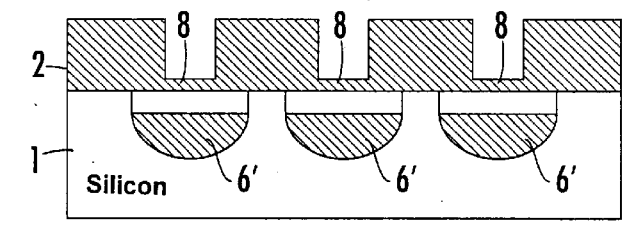
Figure 2F:
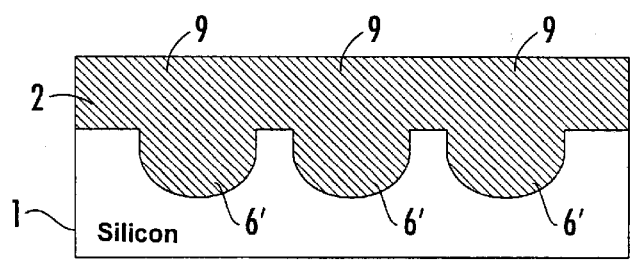
Figure 3A:
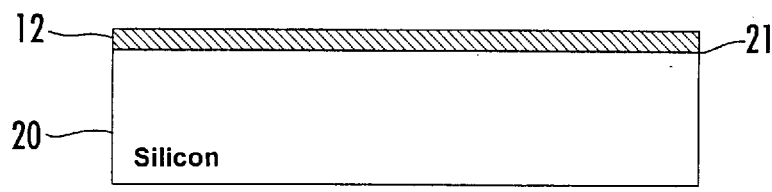
FIGS. 3A–3I are diagrammatic sectional views of a JTE semiconductor structure at respective steps of the JTE oxide process of the present invention.
Figure 3B:
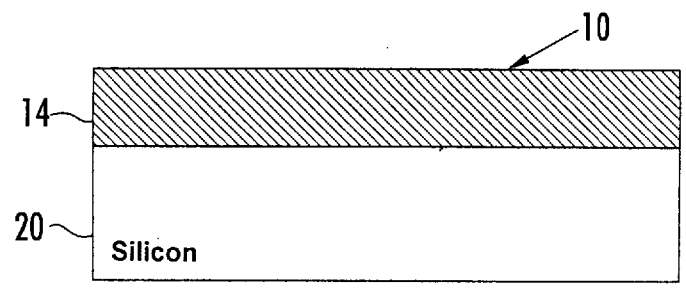
Figure 4:
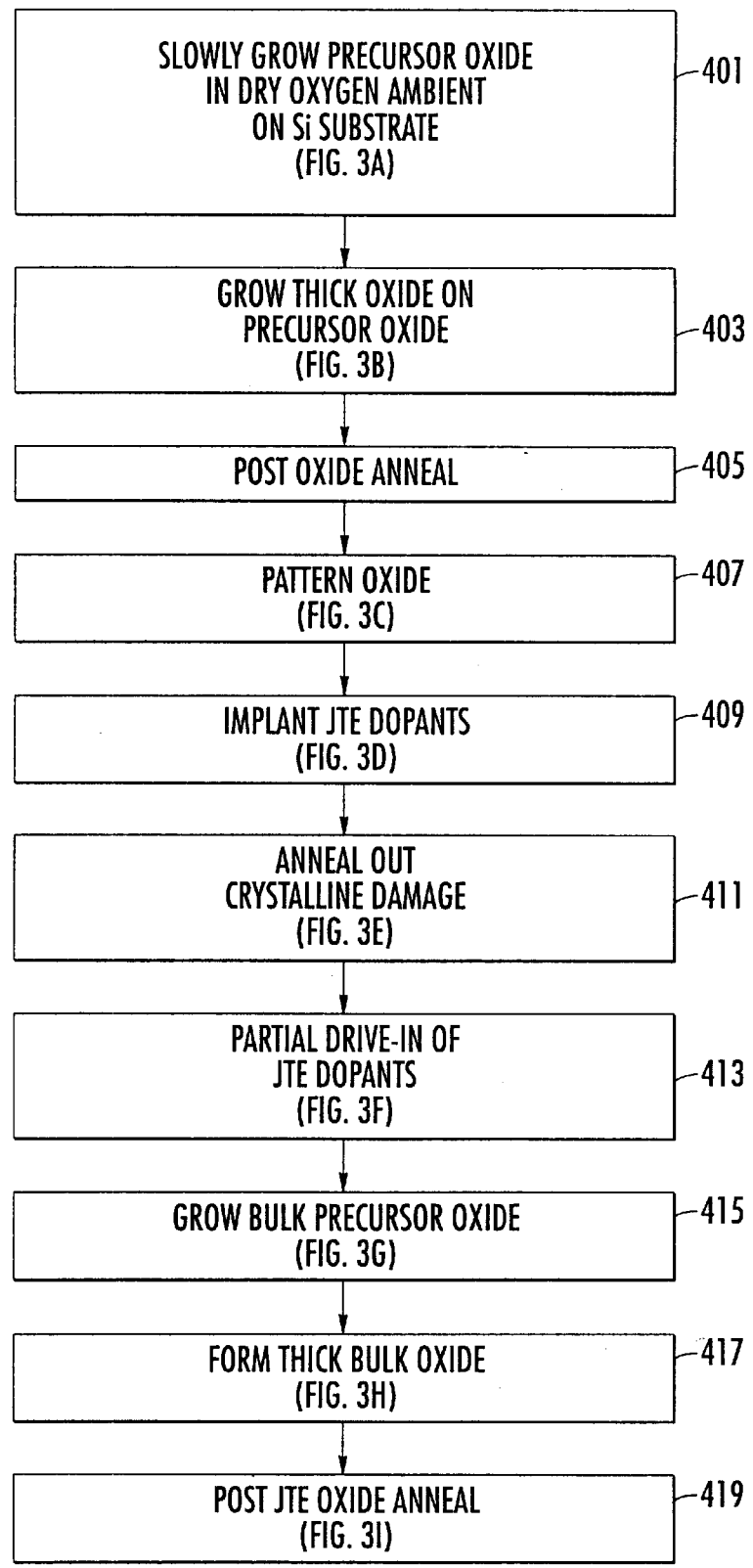
FIG. 4 shows the sequence of steps of the JTE oxide formation process of the invention.

As shown in FIGS. 3A and 3B, the oxidation formation process begins by forming a relatively thick oxide layer 10 (e.g., 8000 Angstroms) on a top surface 21 of a clean or epitaxial semiconductor substrate 20, such as a silicon substrate of a first conductivity type (e.g., N type as a non-limiting example). In order to ensure precise control of subsequent oxide formation, in step 401, oxide layer 10 is formed by first slowly growing a relatively thin and dense precursor oxide layer, such as silicon dioxide 12 (FIG. 3A) in a dry oxygen ($O_2$) ambient, for example, at a temperature of 900° C., for 120 minutes, to a first thickness (e.g., 300 Angstroms).

Next, in step 403, the thickness of the silicon dioxide layer 10 is increased, by introducing steam (e.g., at a temperature on the order of 1050° C.) or a wet $O_2$ atmosphere (at a temperature of 1050° C.), for 120 minutes, causing the growth of a relatively thick silicon dioxide layer 14 at the silicon surface and incorporating therein the thin dense oxide layer 12, to a thickness on the order of 8000 Angstroms, as shown in FIG. 3B. Because the thin precursor oxide layer 12 is a highly compact oxide layer, it increases the density and quality of the thick oxide layer 14, relative to the oxide layer rapidly formed by the prior art process described previously.

Figure 3C:
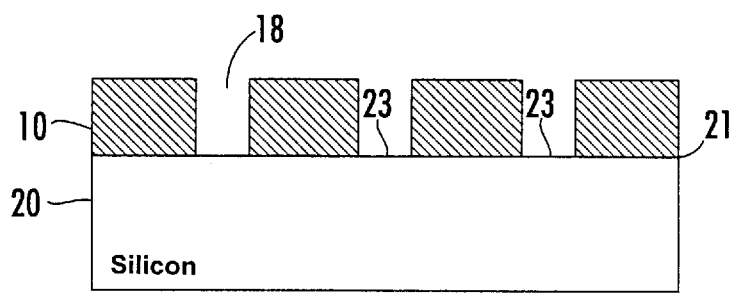

Next, as shown at step 405, a post-oxidation anneal is performed in a dry ambient or non-oxidizing atmosphere, which serves to substantially reduce Qox and Dit. For this purpose, the anneal may be carried out at a temperature on the order of 50° C. greater than the steam oxidation temperature (or 1100° C. in the present example), for 30 minutes, in an $N_2$ ambient. The oxide-coated wafer is then masked, etched and cleaned/rinsed in a conventional manner in step 407, to provide at least one (e.g., a plurality of) implant apertures 18 in the oxide layer 10, which thereby selectively expose corresponding (JTE dopant-implant) surface portions 23 in the top surface 21 of the substrate 20, as shown in FIG. 3C.

Figure 3D:
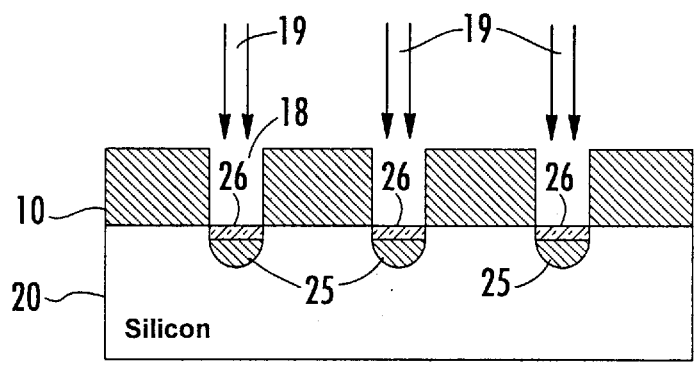

In step 409, using a conventional implant operation, such as that described previously, conductivity type determining impurities 19 (e.g., P-type in the present example) are introduced (implanted) through the implant apertures 18 of the oxide layer 10, so as to form a plurality of (P-type) conductivity-modifying semiconductor (JTE) regions 25 that extend to a prescribed implant depth from the top surface 21 of the substrate 20, as shown in FIG. 3D. As described previously, this implant step causes crystalline damage in those portions 26 of the JTE regions 25 adjacent to the surface 21, which must be removed to prevent stacking fault formation.

Figure 3E:
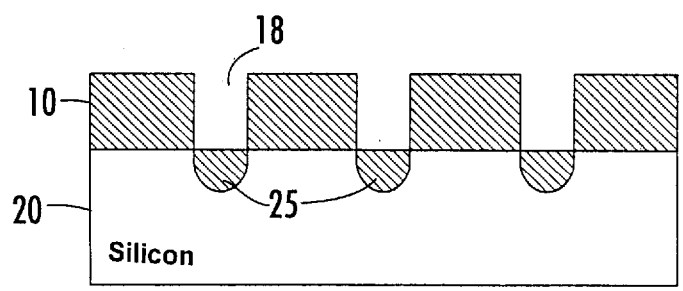

For this purpose, at step 411, the substrate is annealed in a non-oxidizing or inert gas ambient, such as but not limited to Ar, $H_2/N_2$ forming gas, $N_2$, and the like, to repair the displaced lattice sites, resulting in the structure of FIG. 3E. As a non-limiting example, this anneal may be carried out at a temperature on the order of 800° C., for a period of 20 minutes. The non-oxidizing atmosphere of the annealing step prevents oxidation of the surface portions 23 of the top surface 21 of the substrate 20 from which the JTE regions extend, and thereby avoids impacting subsequent oxide formation. A dry oxide ambient cannot be used to anneal out the crystalline damage during this step, since the formation of a highly dense oxide layer may cause the formation of oxidation-induced stacking faults.

Figure 3F:
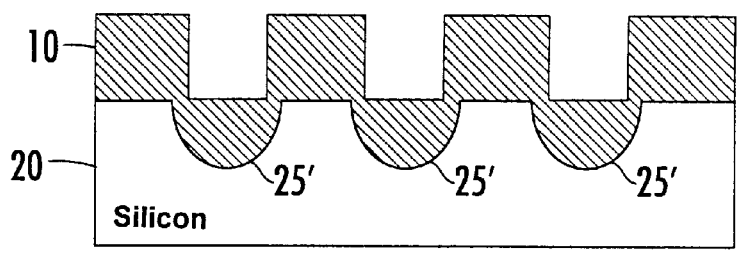

In step 413, a partial drive-in of the conductivity type determining JTE dopants in regions 25 away from the near-surface portions into adjoining (surrounding) material of the semiconductor substrate 20 is performed, resulting in the expanded region structure 25' shown in FIG. 3F. This partial drive-in serves to prevent segregation of the dopant into the oxide that will be subsequently grown. The respective time and temperature parameters for this step may be on the order of 160 minutes at 1200° C. The less than total dopant drive-in during this step conserves thermal budget, providing for substantial annealing time after the thickness of JTE termination oxide is finalized.

Figure 3G:
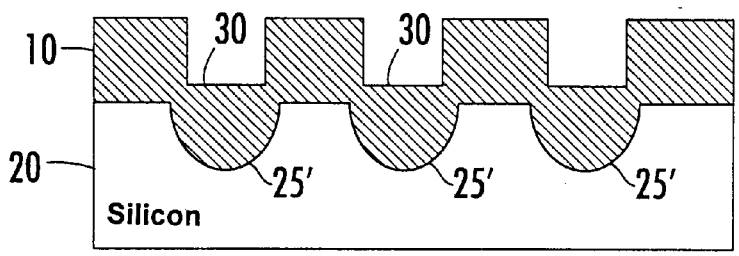

Next, as shown in FIG. 3G, and at step 415, a relatively thin and highly densified bulk precursor oxide layer 30 is grown on the exposed JTE dopant-implanted surface portions 23 of the top surface 21 of the substrate 20, in a dry $O_2$ ambient, for example, at a temperature of 1050° C., for 45 minutes, to a thickness on the order of 600 Angstroms. Like the thin precursor oxide layer 12 formed in step 401, the densified bulk precursor oxide layer 30 ensures precise control of subsequent bulk oxide formation.

Figure 3H:
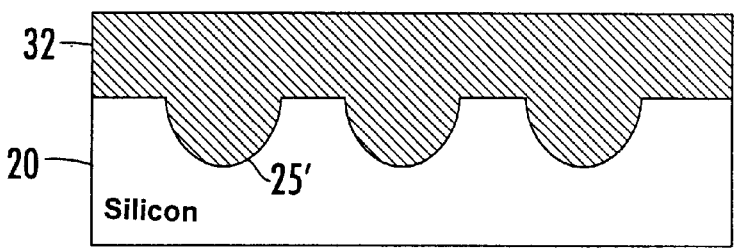

Following the formation of the thin precursor oxide layer 30 within the implant apertures 18, at step 417 the bulk of the JTE oxide is formed by introducing steam (e.g., at a temperature on the order of 1050° C.) or a wet $O_2$ atmosphere (at a temperature of 1050° C.), for 170 minutes, causing the growth of a relatively thick silicon dioxide layer 32 on the surface of the silicon, and incorporating the thin dense oxide layer 30, for example to a thickness on the order of one micron, as shown in FIG. 3H. Again since bulk precursor oxide layer 30 is highly compact and densified, it increases the density and quality of the thick JTE oxide layer 32. During step 417, the thickness of dense oxide layer 30 is not significantly altered, as its thickness and density make it a substantially diffusion-limited film.

Figure 3I:
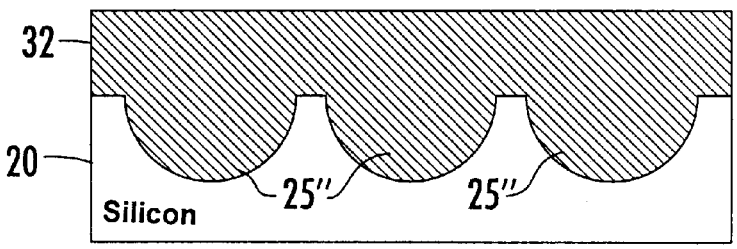

Once the bulk oxide 32 has been grown to its desired thickness, the substrate is again annealed in a non-oxidizing or inert gas ambient, such as but not limited to Ar, $H_2/N_2$ forming gas, $N_2$, and the like, referenced above, to effect a further drive-in of the conductivity type determining JTE dopants—forming regions 25", shown in the structure of FIG. 3I. As a non-limiting example, this final, post-JTE oxidation anneal may be carried out at a temperature on the order of 1100° C., for a period of 30 minutes. The 'dry' or non-oxidizing atmosphere of the post JTE oxidation annealing step substantially lowers Qox and Dit. The extent to which high voltage edge stability is improved, as represented by a reduction in Qox and Dit, may be determined by carrying out conventional capacitance-voltage and associated electrical parameter measurements, such as those commonly employed for MOS capacitor structures.

As will be appreciated from the foregoing description, the above-referenced shortcomings of conventional JTE oxide formation are effectively obviated by employing precursor densified thin oxide layers to improve the quality of subsequently formed thicker oxide layers, and performing multiple anneals in a dry or non-oxidizing atmosphere to remove implant damage and to set finalized geometry parameters. The use of such an atmosphere for post JTE oxidation annealing substantially lowers Qox and Dit.

While we have shown and described an embodiment in accordance with the present invention, it is to be understood that the same is not limited thereto but is susceptible to numerous changes and modifications as are known to a person skilled in the art, and we therefore do not wish to be limited to the details shown and described herein, but intend to cover all such changes and modifications as are obvious to one of ordinary skill in the art.

What is claimed:

1. A method of manufacturing a semiconductor device comprising the steps of:

(a) forming a relatively thin and dense precursor oxide layer on a semiconductor substrate, thermally growing a relatively thick oxide layer that incorporates therein said precursor oxide layer by exposing the thin and dense precursor oxide layer to one of steam or wet $O_2$ at a temperature elevated above the temperature range used for forming the relatively thin and dense precursor oxide layer, conducting a post-oxidation anneal in a non-oxidizing atmosphere at a temperature greater than the steam or wet $O_2$ temperature, so as to substantially reduce total oxide charge and $SiO_2$—Si interfaced trap density (Dit), patterning said relatively thick oxide layer to form an impurity implant aperture therein, so as to expose a selected surface portion of said semiconductor substrate, and introducing conductivity type determining impurities into said selected surface portion of said semiconductor substrate, so as to form a region containing near-surface region crystalline damage;

(b) annealing the structure resulting from step (a) in a non-oxidizing atmosphere to reduce said near-surface region crystalline damage;

(c) performing partial drive-in of said conductivity type determining impurities away from said near-surface region to material of said semiconductor substrate adjoining said region;

(d) forming an insulator layer upon said region by first forming a thin bulk precursor oxide layer in a dry oxygen ($O_2$) to thermally form a bulk junction termination extension (JTE) oxide; and (e) annealing the structure resulting from step (d) in a non-oxidizing atmosphere and effecting a further drive-in of said conductivity type determining impurities to material of said semiconductor substrate adjoining said region.

2. A method according to claim 1, wherein step (d) comprises forming said insulator layer to a first thickness upon said region in a first ambient, and thereafter increasing the thickness of said insulator in a second ambient.

3. A method according to claim 2, wherein step (d) comprises forming a first oxide layer to said first thickness upon said region in a first oxide ambient, and thereafter forming, in a second oxide ambient, a second oxide layer, that incorporates therein said first oxide layer, to a second thickness greater than said first thickness.

4. A method according to claim 1, wherein step (a) comprises implanting said conductivity type determining impurities into said selected surface portion of a semiconductor substrate, so as to form said region containing near-surface region crystalline damage.

5. A method according to claim 3, wherein step (d) comprises growing said first oxide layer as a relatively thin and highly densified bulk oxide precursor layer, and growing said second oxide layer as a bulk JTE oxide in a steam or wet oxygen atmosphere.

6. A method of manufacturing a junction termination extension (JTE) semiconductor device comprising the steps of:

(a) forming a first densified relatively thin and dense precursor oxide layer on a semiconductor substrate in a dry oxygen ($O_2$) ambient;

(b) thermally growing on said semiconductor substrate a second relatively thick oxide layer that incorporates therein said first oxide layer by exposing said first densified relatively thin and dense precursor oxide layer to one of steam or wet $O_2$ at a temperature elevated above the temperature range used for forming the relatively thin and dense precursor oxide layer;

(c) performing a post-oxidation anneal of the structure resulting from step (b), in a non-oxidizing atmosphere at a temperature greater than the steam or wet $O_2$ temperature so as to reduce total oxide charge (Qox) and oxide-substrate interface trap density (Dit) parameters;

(d) patterning said first and said oxide layers and implanting JTE dopants through implant apertures of the patterned oxide layers, thereby forming a plurality of JTE regions that extend to a prescribed implant depth from the top surface of said substrate;

(e) annealing said substrate in a non-oxidizing atmosphere to remove near surface crystalline damage caused by implantation of JTE dopants, and effecting a partial drive-in of implanted JTE dopants;

(f) growing a third, relatively thin and highly densified bulk precursor oxide layer on exposed JTE-implanted surface portions of said substrate by forming the bulk precursor oxide layer in a dry oxygen ($O_2$) ambient;

(g) thermally growing a fourth, relatively thick bulk oxide layer on said third oxide layer by introducing one of steam or wet $O_2$ to form thermally a bulk junction termination extension (JTE) oxide; and (h) annealing said substrate in a non-oxidizing gas ambient, so as to further drive-in said JTE dopants, and reduce said total oxide charge (Qox) and oxide-substrate interface trap density (Dit) parameters.

7. A method according to claim 6, wherein step (a) is carried out in a dry oxygen ambient, and step (b) is carried out in a wet or stream atmosphere.

8. A method according to claim 6, wherein step (c) is carried out in a dry ambient or non-oxidizing atmosphere.

* * * * *